United States Patent [19]

Kato

[11] Patent Number: 5,555,210
[45] Date of Patent: Sep. 10, 1996

[54] SEMICONDUCTOR MEMORY DEVICE

[75] Inventor: Yoshiharu Kato, Kasugai, Japan

[73] Assignees: Fujitsu Limited, Kawasaki; Fujitsu VLSI Limited, Kasugai, both of Japan

[21] Appl. No.: 305,880

[22] Filed: Sep. 15, 1994

[30] Foreign Application Priority Data

Sep. 17, 1993 [JP] Japan .................................. 5-231869

[51] Int. Cl.$^6$ ....................................... G11C 7/00
[52] U.S. Cl. .................. 365/196; 365/189.01; 365/205; 365/207
[58] Field of Search ..................... 365/205, 196, 365/207, 208, 189.01

[56] References Cited

U.S. PATENT DOCUMENTS 5,274,595  12/1993  Seok et al. .................. 365/196 X
5,302,867   4/1994  Ahn ............................ 365/196 X
5,303,196   4/1994  Sang et al. .................. 365/196 X

*Primary Examiner*—Do Hyun Yoo
*Attorney, Agent, or Firm*—Nikaido, Marmelstein, Murray & Oram LLP

[57] ABSTRACT

A semiconductor memory device writes data to memory cells contained in the memory device in response to an enable signal supplied thereto. The memory device includes, a pair of bit lines connected to the memory cells, and a sense amplifier connected to the pair of bit lines to latch cell data read from the memory cells. The pair of bit lines couples to a data writing circuit, which writes data to the memory cells in response to the first enable signal. The memory device also includes a switching circuit connected to the sense amplifier, for disabling the sense amplifier in response to the first enable signal.

6 Claims, 5 Drawing Sheets

SEMICONDUCTOR MEMORY DEVICE

BACKGROUND OF THE INVENTION

1. Field of the Invention

The present invention relates generally to a semiconductor memory device having a plurality of memory cells. More particularly, this invention relates to a circuit device for writing data into the memory cells and reading data therefrom.

2. Description of the Related Art

Recent advances in the operational speeds of central processing units have fueled the demand for semiconductor memory devices having faster operational speeds that consume less power than previous semiconductor memory devices. To achieve this, circuits necessary to read and write data to individual memory cells, incorporated in the semiconductor memory device, need to operate at faster speeds while consuming less power than previous read/write circuits.

FIG. 1 illustrates one type of conventional DRAM constructed as a semiconductor memory device. The memory cell array of the DRAM has a plurality of memory cells C (only two shown), and plural pairs of bit lines BL and /BL (only one pair shown) connected to the memory cells C. Word lines WL are connected to the respective memory cells C. When one word line WL is selected by a row decoder (not shown), cell data stored in the associated memory cell C is read onto the associated bit lines BL and /BL.

Sense amplifiers 1 are connected to the associated pairs of bit lines BL and /BL. Each sense amplifier 1 is enabled based on a first and second drive signals φA and φB supplied from a sense amplifier driver 2. The sense amplifier driver 2 outputs the drive signals φA and φB in response to a sense amplifier enable signal φS supplied thereto.

The bit lines BL and /BL are connected via column gates Tr1 and Tr2 to data buses DB and /DB, respectively. A column select signal φY is input to the column gates Tr1 and Tr2 from a column decoder (not shown). When the column select signal φY goes high, the column gates Tr1 and Tr2 switch on. In data read mode, cell data amplifier by the sense amplifier 1 is read onto the data buses DB and /DB, and the cell data on the data buses DB and /DB is read out as output data $D_{out}$ via an output buffer circuit (not shown).

The data buses DB and /DB are connected to a write amplifier 3, which receives write data φDATA and write amplifier enable signals φW. In data write mode, the write amplifier 3 supplies the received write data φDATA onto the data buses DB and /DB in response to the write amplifier enable signal φW. The write data φDATA is written into the selected memory cell C via the data buses DB and /DB, the column gate Tr1 and TR2 and the bit lines BL and /BL.

FIG. 2 shows the sense amplifier 1 and the sense amplifier driver 2. The sense amplifier driver 2 has four inverts 4a to 4d, a P channel MOS transistor Tr3, and N channel MOS transistors Tr4 and Tr5. The inverter 4a receives the sense amplifier enable signal φS. The output terminal of the inverter 4a is connected to the gate of the transistor Tr3 via the two inverts 4c and 4d to the gate of the transistor Tr4, and to the gate of the transistor Tr5 via the inverter 4b. The transistor Tr3 has a source connected to a high potential power supply Vcc and a drain connected to the drain of the transistor Tr4. The transistor Tr5 has a drain connected to the source of the transistor Tr4 and a source connected to a low potential power supply Vss which is grounded. The first drive signal φA is output from the drain of the transistor Tr3, and the second drive signal φB is output from the drain of the transistor Tr5.

When the sense amplifier enable signal φS goes high, the transistors Tr3 and Tr5 switch on and the transistor Tr4 switches off. As a result, the level of the first drive signal φA approximates the potential of the power supply Vcc while the potential of the second drive signal φB nearly reaches that of ground. When the sense amplifier enable signal φS goes low, the transistors Tr3 and Tr5 turn off while the transistor Tr4 turns on. At this time, the potentials of the drive signals φA and φB are both nearly the same.

Since the sense amplifier 1 use a well-known flip-flop circuit construction, its detailed description will be omitted. When the first drive signal φA approaches the potential of the power supply Vcc, and when the second drive signal φB approaches the potential level of the power supply Vss (i.e., around ground level), the sense amplifier 1 is enabled, causing the slight difference in potential existing between the bit lines BL and /BL to increase. When the levels of the drive signals φA and φB become substantially the same, the sense amplifier 1 is disabled and stops functioning.

FIG. 3 shows the structure of the write amplifier 3, which includes three inverters 4e, 4f and 4g and two transfer gates Tr6 and Tr7 each of which are formed using an N channel MOS transistor. The write amplifier enable signal φW is input to the gates of the transfer gates Tr6 and Tr7. When this enable signal φW goes high, the transfer gates Tr6 and Tr7 turn on.

The write data φDATA is supplied to the first transfer gate TR6 via the inverters 4e and 4f and to the second transfer gate Tr7 via the inverter 4g. When both the write amplifier enable signal φW and the write data φDATA are set high, high level data is output on the data bus DB and low level data is output on the data bus /DB. When the write amplifier enable signal φW is high and the write data φDATA is low, low level data is output on the data bus DB and high data is output on the data bus /DB.

The writing operation of the conventional DRAM will now be described with reference to FIG. 4. Normally, in DRAMs, the sense amplifier 1 is enabled even in a mode other than the normal read mode, for the purpose of refreshing cell data. Even in write mode, the sense amplifier 1 may be enabled in response to a high level sense amplifier enable signal φS. With this situation, when the write amplifier enable signal φW goes high, the write data φDATA input to the write amplifier 3 is supplied to the data buses DB and /DB, and is output on the bit lines BL and /BL selected based on the column select signal φY. The write data on the bit lines BL and /BL is written in the memory cells C selected in accordance with the selection of the word line WL.

According to the conventional DRAM, the sense amplifier 1 is enabled even in a write mode to write data in the memory cells. If the data held in the sense amplifier 1 is complementary to the write data sent to the sense amplifier 1 from the write amplifier 3, the data held in the sense amplifier 1 would be forcibly inverted by the dominant signal from the write amplifier 3. Then, the write data from the write amplifier 3 is written in the selected memory cell via the sense amplifier 1.

With such a construction, a significant amount of time is required for the write amplifier 3 to invert the data held in the sense amplifier 1. Consequently, too much time is needed for the write time t1, including the time needed for its inversion. This leads to lower data writing speeds. In addition, the inversion of the latched data in the enabled sense amplifier 1, produces a flowthrough current in the sense amplifier 1 and increases the output current of the write amplifier 3 to the bit lines BL and /BL, thus increasing the consumed power of the DRAM.

SUMMARY OF THE INVENTION

Accordingly, it is a primary objective of the present invention to provide a semiconductor memory device which has an improved writing speed while reducing the power consumed by the memory device.

To achieve the foregoing and other objects and in accordance with the purpose of the present invention, an improved semiconductor memory device is provided.

The semiconductor memory device according to the present invention executes data writing based on a first enable signal supplied thereto. The memory device comprises memory cells to be selected based on selection of a word line connected to the cells, a pair of bit lines connected to the cells, and a sense amplifier connected to the pair of bit lines to latch cell data read from the memory cells. A data writing circuit is connected to the pair of bit lines, and outputs write data to the selected memory cells in response to the first enable signal. The memory device further comprises a circuit, connected to the sense amplifier, for disabling the sense amplifier in response to the first enable signal.

BRIEF DESCRIPTION OF THE DRAWINGS

The features of the present invention that are believed to be novel are set forth with particularity in the appended claims. The invention, together with objects and advantages thereof, may best be understood by reference to the following description of the presently preferred embodiments together with the accompanying drawings in which:

DETAILED DESCRIPTION OF THE PREFERRED EMBODIMENTS

Figure 5:
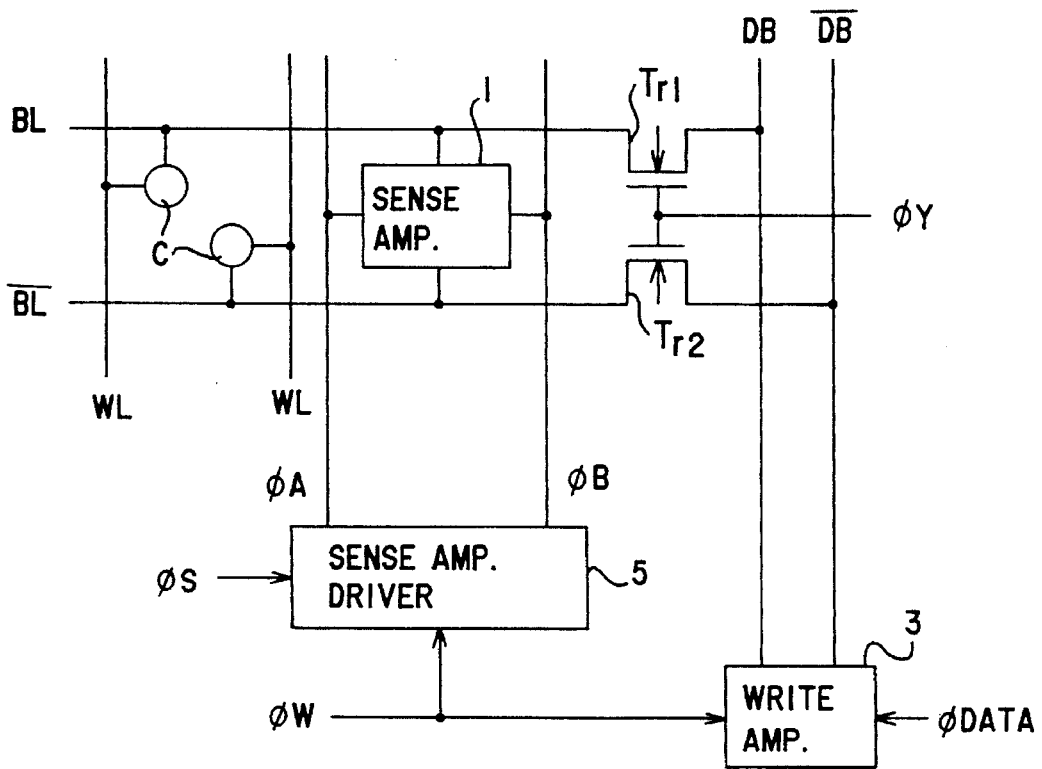
FIG. 5 is a block diagram illustrating a DRAM according to a first embodiment of the present invention.
Figure 6:
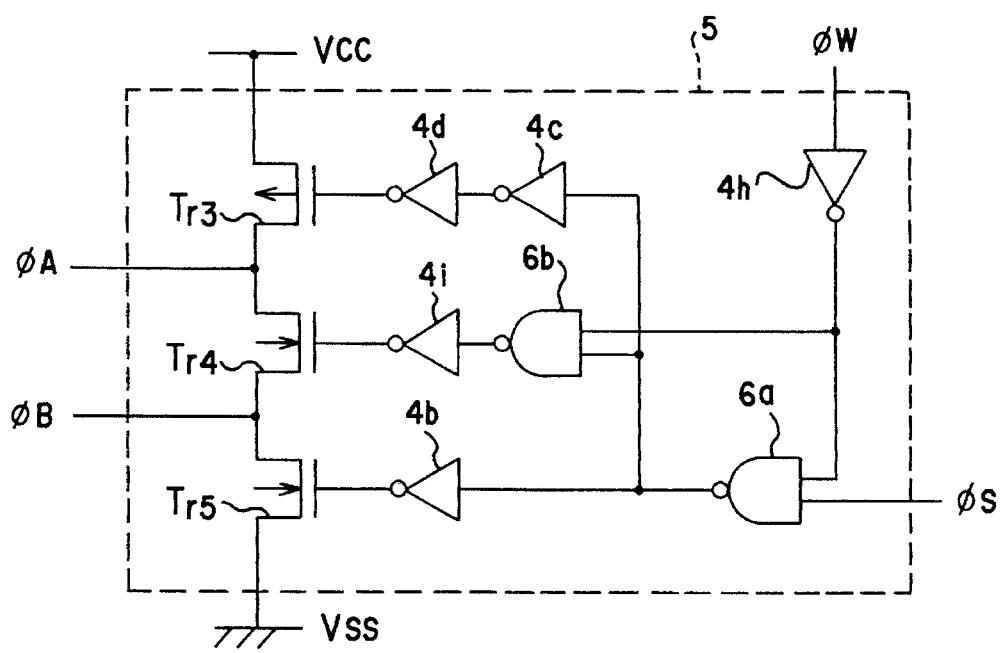
FIG. 6 is a detailed circuit diagram showing a sense amplifier driver of the DRAM as shown in FIG. 5.

FIG. 5 shows a DRAM according to a first embodiment of the present invention. Like or same reference numerals are given to those corresponding or identical to the components of the above-described conventional art. A sense amplifier driver 5 according to this embodiment receives a write amplifier enable signal φW as well as a sense amplifier enable signal φS. FIG. 6 shows the detailed structure of the sense amplifier driver 5. The sense amplifier driver 5 differs from the sense amplifier driver 2 of the conventional art shown in FIG. 2 in that the driver 5 further has two inverts 4h and 4i and first and second NAND gates 6a and 6b and does not have the inverter 4a shown in FIG. 2.

Each of the first and second NAND gates 6a and 6b has two input terminals. The first NAND gate 6a has an input terminal to receive the sense amplifier enable signal φS and an input terminal to receive the write amplifier enable signal φW via the inverter 4h. The second NAND gate 6b have an input terminal to receive the write amplifier enable signal φW via the inverter 4h and an input terminal connected to the output terminal of the first NAND gate 6a.

The output terminal of the first NAND gate 6a is also connected to the gate of a transistor Tr3 via two inverters 4c and 4d and to the gate of a transistor Tr5 via an inverter 4b. The output terminal of the second NAND gate 6b is connected to the gate of a transistor Tr4 via the inverter 4i.

When the write amplifier enable signal φW is high, the output signals of the NAND gates 6a and 6b will always be high. Accordingly, the transistors Tr3 and Tr4 turn off while the transistor Tr4 is maintained off. As a result, first and second drive signals φA and φB have a floating potential. With the write amplifier enable signal φW being low, the sense amplifier driver 5 functions based on the sense amplifier enable signal φS in the same manner as the conventional driver 2.

Generally, the memory cell array of a DRAM is separated into a plurality of blocks. The sense amplifier driver 5 in this embodiment is provided for each such block, so that each sense amplifier driver 5 is connected to a plurality of sense amplifiers 1 in the associated block.

Figure 7:
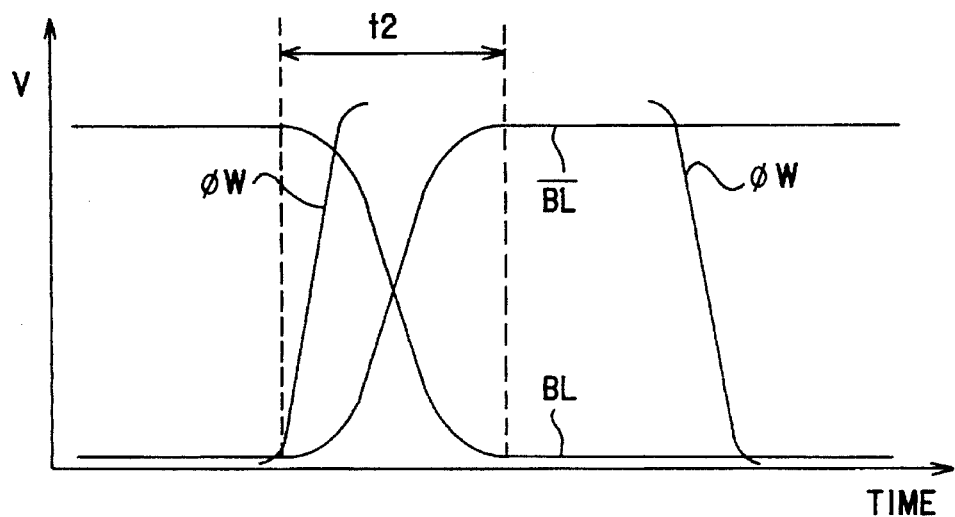
FIG. 7 is a waveform diagram for the writing operation of the first embodiment.

The writing operation of the DRAM according to this embodiment will now be discussed with reference to FIG. 7. In order to refresh cell data, the individual sense amplifiers 1 in the DRAM function at preset periods of time. When the sense amplifier enable signal φS goes high the sense amplifiers 1 is enabled for a given period even during the write mode. When the write amplifier enable signal φW goes high, the potentials of drive signals φA and φB, out from the sense amplifier driver 5, float and thereby disable the sense amplifier 1.

Write data φDATA input to the write amplifier 3 is output to the bit lines BL and /BL selected by a column select signal φY via data buses DB and /DB in response to the high level write amplifier enable signal φW. The write data on the bit lines BL and /BL are then written in the memory cells C selected by a selected word line WL. At that time, the sense amplifiers 1 are disabled. Even when the cell data read on the bit lines BL and /BL have a complementary relation with the write data output from the write amplifier 3, the potentials of the bit lines BL and /BL are promptly inverted to write the write data into the selected memory cells.

According to this embodiment, a write time t2 needed for the write amplifier 3 to invert the potentials of the bit lines BL and /BL is about 2 to 3 nanoseconds. This writing time t2 is about a half the writing time t1 of the conventional art.

In the DRAM of this embodiment, as apparent from the above, the sense amplifiers 1 become disabled in synchronism with the writing operation of the write amplifier 3. This means that the writing speed is faster than that of the conventional art. Further, the data latched in the enabled sense amplifier 1 need not be inverted, requiring no extra consumed power for data inversion.

Figure 1:
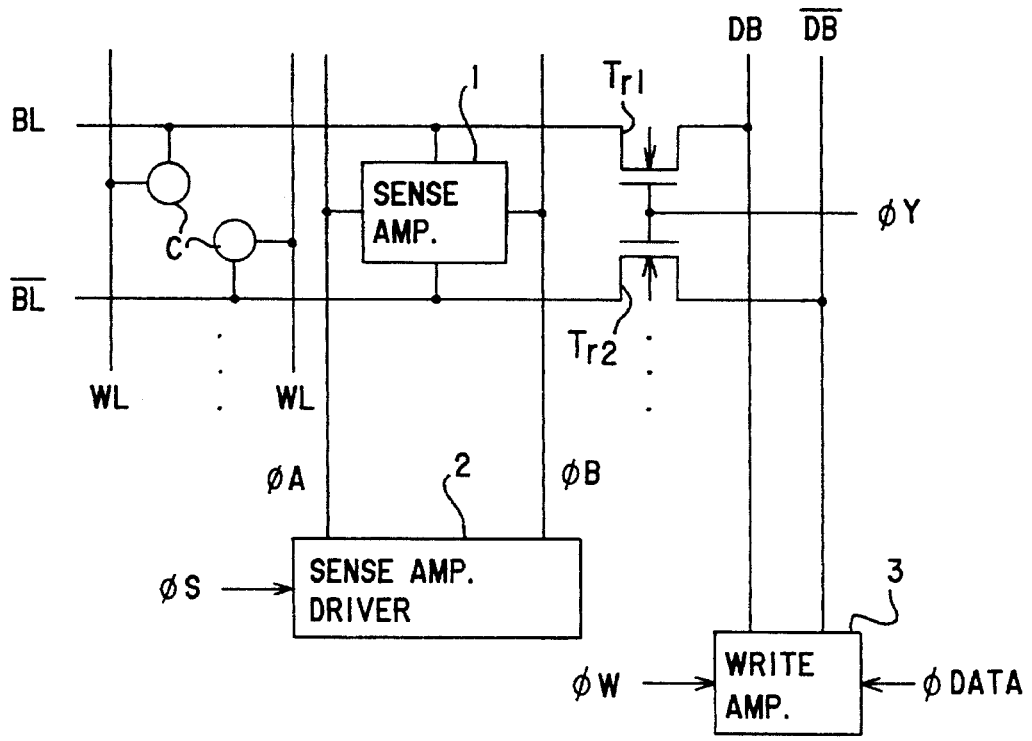
FIG. 1 is a block diagram illustrating a conventional DRAM.
Figure 2:
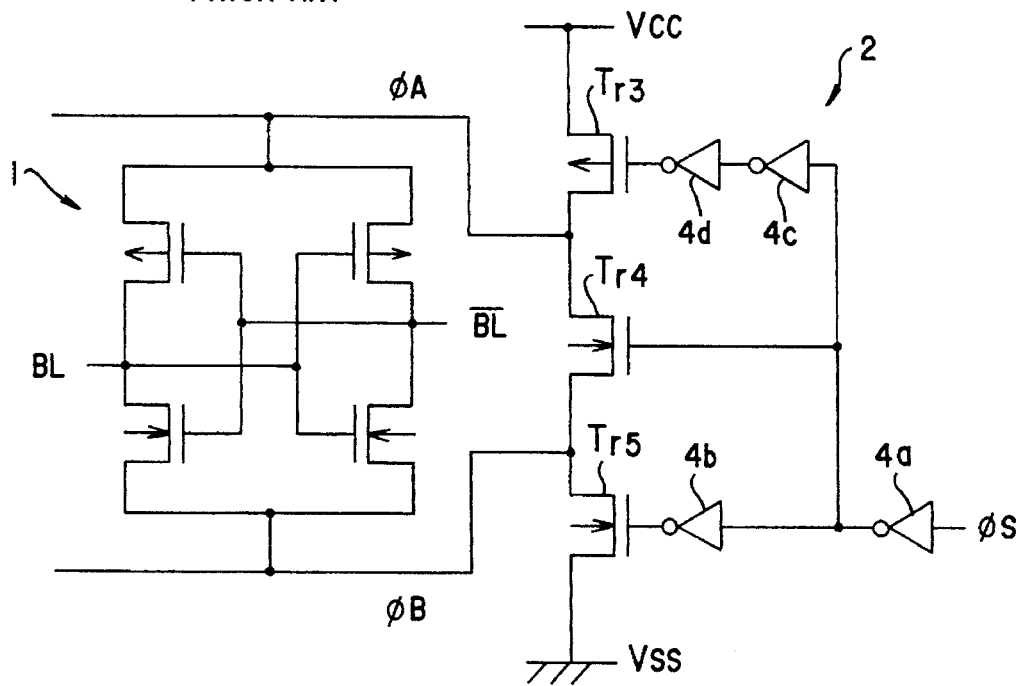
FIG. 2 is a detailed circuit diagram showing a sense amplifier and sense amplifier driver of the conventional DRAM as shown in FIG. 1.
Figure 3:
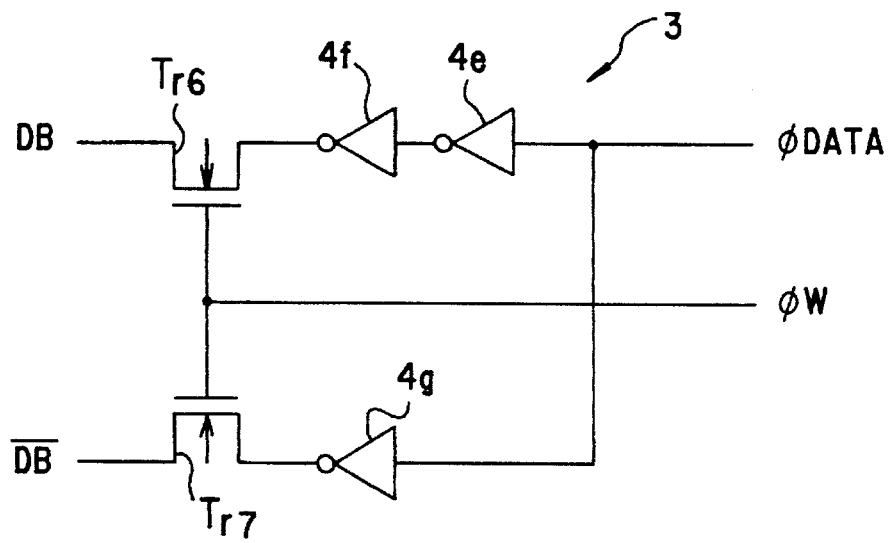
FIG. 3 is a detailed circuit diagram showing a write amplifier of the conventional DRAM as shown in FIG. 1.
Figure 4:
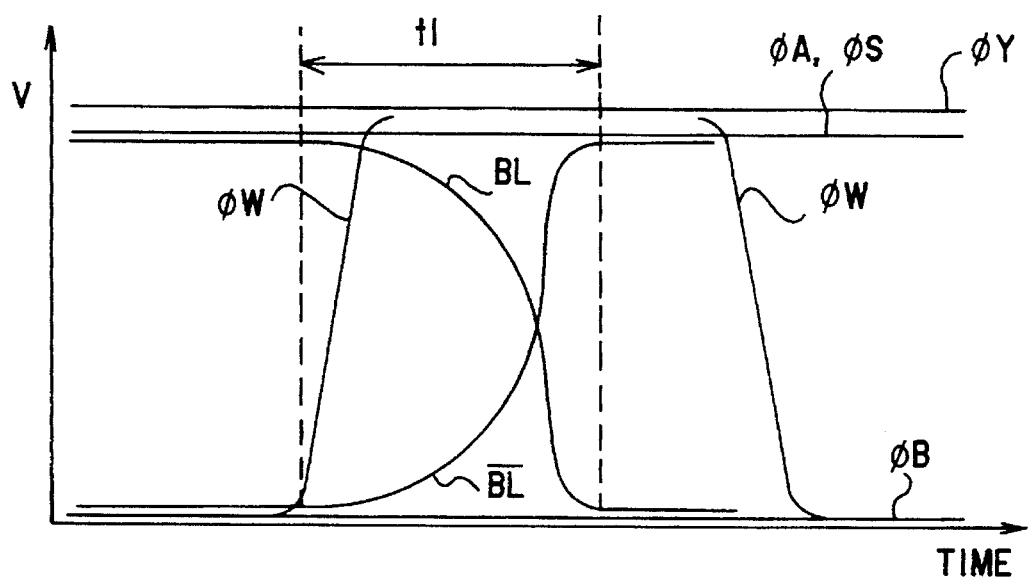
FIG. 4 is a waveform diagram for the writing operation of the conventional DRAM.
Figure 8:
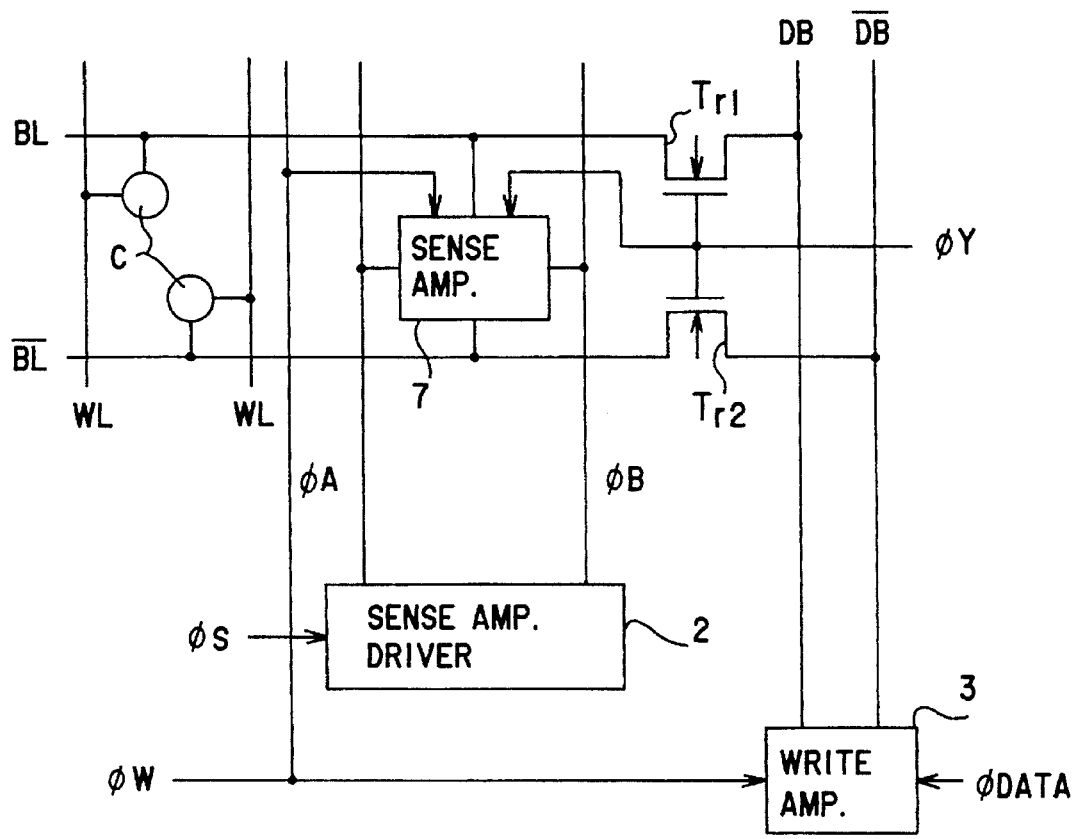
FIG. 8 is a block diagram illustrating a DRAM according to a second embodiment of this invention.

A second embodiment of this invention will be described below with reference to FIGS. 8 and 9. A sense amplifier driver 2 in the second embodiment is the same as that of the conventional art as shown in FIG. 2. This embodiment differs from the conventional art in that the individual sense amplifiers 7 are connected to the sense amplifier driver 2 via a switching circuit which functions based on the write amplifier enable signal φW and column select signal φY.

Figure 9:
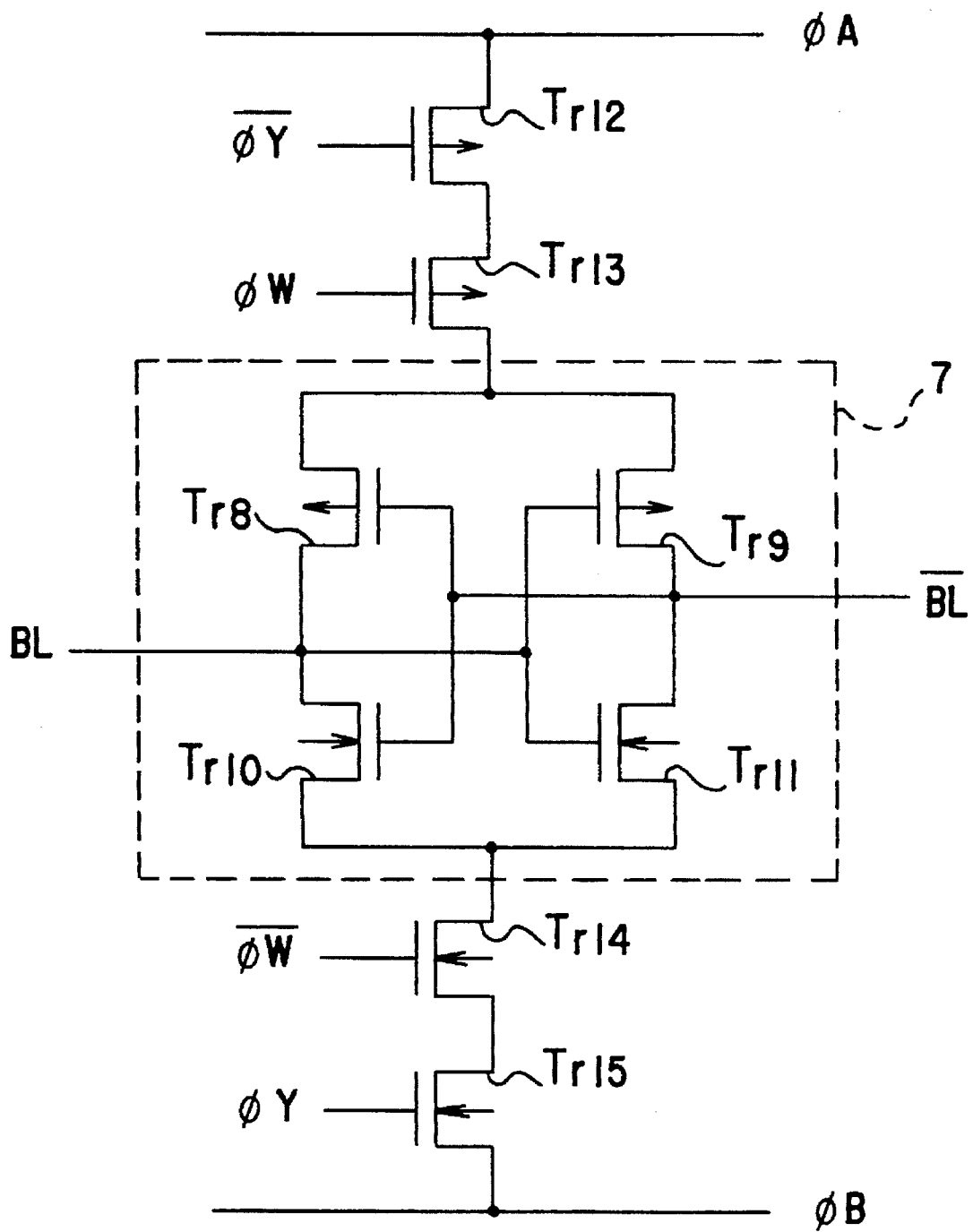
FIG. 9 is a detailed circuit diagram showing a sense amplifier of the DRAM as shown in FIG. 8.

FIG. 9 shows the detailed structure of the sense amplifier 7 and the switching circuit. Two P channel MOS transistors Tr8 and Tr9 and two N channel MOS transistors Tr10 and Tr11 form the sense amplifier 7 having a flip-flop structure similar to that of the conventional art. The switching circuit connected to this sense amplifier 7 includes two P channel MOS transistors Tr12 and Tr13 and two N channel MOS transistors Tr14 and Tr15.

The first drive signal φA is input to the sources of the transistors Tr8 and Tr9 via the P channel MOS transistors Tr12 and Tr13. The second drive signal φB is input to the sources of the transistors Tr10 and Tr11 via the N channel MOS transistors Tr14 and Tr15.

The complement of column select signal φY, signal /φY, is input to the gate of the transistor Tr12, while the write amplifier enable signal φW is input to the gate of the transistor Tr13. The column select signal φY is input to the gate of the transistor Tr15, and the complement of the write amplifier select signal φW, signal /φW, is input to the gate of the transistor Tr14.

In modes other than the write mode, the write amplifier enable signal φW has a low level. When a specific sense amplifier 7 is selected by the high level column select signal φY, the transistors Tr12, Tr13, Tr14 and Tr15 of the selected sense amplifier 7 all turn on thereby enabling the sense amplifier 7. This allows cell data read on the bit lines BL and /BL from the selected memory cells to be amplified and latched by the sense amplifier 7. In write mode, the write amplifier enable signal φW goes high. In this situation, the transistor Tr13 and Tr14 of the sense amplifier 7, selected by the high level column select signal φY turn off, cutting the supply of the drive signals φA and φB to the selected sense amplifier 7.

According to the second embodiment, the sense amplifier selected by the column select signal φY can be disabled in write mode. This can improve the data writing speed by the write amplifier 3 and can allow the amount of power consumed by the DRAM to be reduced, like the first embodiment.

Although only two embodiments of the present invention have been described herein, it should be apparent to those skilled in the art that the present invention may be embodied in many other specific forms without departing from the spirit or scope of the invention.

Therefore, the present examples and embodiments are to be considered as illustrative and not restrictive and the invention is not to be limited to the details given herein, but may be modified within the scope of the appended claims.

What is claimed is:

1. A semiconductor memory device, responsive to a first enable signal provided thereto, comprising:

a plurality of memory cells;

a word line communicatively coupled to said memory cells;

a first bit line communicatively coupled to said memory cells;

a sense amplifier, connected to said first bit line, for latching cell data read from said memory cells;

a data writing circuit, connected to said first bit line and responsive to said first enable signal, for writing data to said memory cells; and switching means, connected to said sense amplifier and responsive to said first enable signal, for disabling said sense amplifier, wherein said switching means includes a sense amplifier driver for supplying a drive signal to said sense amplifier, said sense amplifier driver terminating the supply of said drive signal to said sense amplifier in response to the first enable signal, and wherein said sense amplifier driver, supplied with power from both a high and a low voltage power supplies, amplifies data in response to said first enable signal and a second enable signal, said sense amplifier driver comprising a first, second and third transistors connected in series between the high and low voltage power supplies, wherein a node between said first and second transistors and a node between said second and third transistors communicatively couple to said sense amplifier; and a control circuit, connected to gates of said first to third transistors, responsive to said first and second enable signals to activate said first and third transistors when both the second enable signal is active sand the first enable signal is inactive, and to deactivate said first and third transistors when the first enable signal is active.

2. The semiconductor memory device according to claim 1, wherein the first enable signal is a write amplifier enable signal, and the second enable signal is a sense amplifier enable signal.

3. A semiconductor memory device, responsive to a first enable signal provided thereto, comprising:

a plurality of memory cells;

a word line communicatively coupled to said memory cells;

a first bit line communicatively coupled to said memory cells;

a sense amplifier, connected to said first bit line, for latching cell data read from said memory cells;

a data writing circuit, connected to said first bit line and responsive to said first enable signal, for writing data to said memory cells; and switching means, connected to said sense amplifier and responsive to said first enable signal, for disabling said sense amplifier, wherein the memory device comprises a second bit line, thereby forming a pair of bit lines; and wherein said data writing circuit includes a pair of column gates provided in association with said pair of bit lines, said column gates being driven based on a column select signal;

a pair of data buses connected to said pair of bit lines via said column gates; and a write amplifier, connected to said pair of data buses, for writing data to selected memory cells in response to said first enable signal.

4. A semiconductor memory device comprising:

a plurality of memory cells;

a word line communicatively coupled to said memory cells;

a bit line communicatively coupled to said memory cells;

a sense amplifier, connected to said bit line, for latching cell data read from one of said memory cells;

a data writing circuit, connected to said bit line and responsive to a write enable signal, for writing data to one of said memory cells; and a sense amplifier disabling means, coupled to said sense amplifier, for disabling said sense amplifier when data writing to a memory cell is performed, wherein said sense amplifier disabling means includes a sense amplifier driver responsive to the write enable signal for disabling said sense amplifier, and wherein said sense amplifier driver is supplied with a sense amplifier enable signal, and includes a NAND gate having a first input terminal receiving the write enable signal and a second input terminal receiving the sense amplifier enable signal.

5. A semiconductor memory device comprising:

a plurality of memory cells;

a word line communicatively coupled to said memory cells;

a bit line communicatively coupled to said memory cells;

a sense amplifier, connected to said bit line for latching cell data read from one of said memory cells;

a data writing circuit, connected to said bit line and responsive to a write enable signal, for writing data to one of said memory cells; and a sense amplifier disabling means, coupled to said sense amplifier, for disabling said sense amplifier when data writing to a memory cell is performed, wherein said sense amplifier disabling means includes a switching element provided between said sense amplifier and a sense amplifier driver, for disconnecting the electrical connection between said sense amplifier and said sense amplifier driver when data writing to a memory cell is performed, and wherein said switching element includes a transistor controlled by the write enable signal.

6. A semiconductor memory device comprising:

a plurality of memory cells;

a word line communicatively coupled to said memory cells;

a bit line communicatively coupled to said memory cells;

a sense amplifier (7), connected too said bit line, for latching cell data read from said memory cells;

a data writing circuit, connected to said bit line and responsive to a write amplifier enable signal, for writing data to said memory cells;

a sense amplifier driver (2), coupled to said sense amplifier, for supplying a drive signal to said sense amplifier; and a switching element (Tr13, Tr14), provided between said sense amplifier (7) and said sense amplifier driver (2), said switching element being responsive to the write amplifier enable signal for selectively connecting said sense amplifier with the sense amplifier driver, wherein said switching element includes a transistor having a gate supplied with the write amplifier enable signal.

\* \* \* \* \*